(12) United States Patent
Liao

(10) Patent No.: US 6,235,596 B1
(45) Date of Patent: May 22, 2001

(54) METHOD FOR MANUFACTURING A MOS DEVICE WITH MULTIPLE THRESHOLD VOLTAGES

(75) Inventor: Kuan-Yang Liao, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/280,357

(22) Filed: Mar. 29, 1999

(30) Foreign Application Priority Data

Mar. 2, 1999 (TW) .................................................. 88103137

(51) Int. Cl.[7] .................................................. H01L 21/336
(52) U.S. Cl. .......................... 438/289; 438/305; 438/306
(58) Field of Search .................................... 438/289, 296, 438/295, 294, 290–293, 305–309; 257/344, 345

(56) References Cited

U.S. PATENT DOCUMENTS 5,847,428 * 12/1998 Fulford, Jr. et al. ................. 257/344
5,950,090 * 9/1999 Chen et al. ........................... 438/296

* cited by examiner

Primary Examiner—David Nelms
Assistant Examiner—Dung A Le
(74) Attorney, Agent, or Firm—Jiawei Huang; J.C. Patents

(57) ABSTRACT

A method for manufacturing a MOS device with multiple threshold voltages is provided. The method comprises providing a substrate. A shallow trench isolation structure is formed in the substrate. The top surface of the shallow trench isolation structure is higher than surface of the substrate. An active region which is surrounded by the shallow trench isolation structure is defined in the substrate. A first process of ion implantation is performed on the substrate except a portion of the substrate under the shallow trench isolation structure. A first spacer is formed on the sidewall of a portion of the shallow trench isolation structure above the substrate in the active region. A second process of ion implantation is performed on the substrate except a portion of the substrate under the shallow trench isolation structure and the first spacer.

5 Claims, 3 Drawing Sheets

METHOD FOR MANUFACTURING A MOS DEVICE WITH MULTIPLE THRESHOLD VOLTAGES

CROSS-REFERENCE TO RELATED APPLICATION

This application claims the priority benefit of Taiwan application serial no. 88103137, filed Mar. 2, 1999, the full disclosure of which is incorporated herein by reference.

BACKGROUND OF THE INVENTION

Field of the Invention

This invention relates to a method for manufacturing a semiconductor device. More particularly, the invention relates to a method for manufacturing a MOS (Metal Oxide Semiconductor) device with multiple threshold voltages in the semiconductor device.

Description of Related Art

The conventional transistor has only two kinds of status, which are "ON" and "OFF". Therefore, the conventional transistor provided in a memory device can only be used for storing a data of a bit, which is either "0" or "1". If there are N bits for storing, there must be an equivalent number of independent transistors to store these N bits data. The capacity for storing data per unit of volume in the memory device can not be efficiently increased as the semiconductor technique has an unexpected development.

For the above-described need, a MOS device with multiple voltages has been developed recently for using in the memory device. A conventional method for manufacturing these kinds of memory devices is forming a gate oxide layer with different thickness for a transistor in the memory device. The other conventional method is forming doped regions with different concentrations for a transistor in the memory device. These two conventional methods for forming a MOS device with multiple threshold voltages has the same feature, which extra masks are necessary for the multiple threshold voltages. The number of masks used in the manufacturing process is an index for the difficulty of the process. If more masks are necessary for a manufacturing process, it is difficult to control the reliability of the products and the reproduction of the pattern of the mask in the process. A choke point for manufacturing the MOS device with multiple threshold voltages is faced in the conventional methods.

SUMMARY OF THE INVENTION

The invention provides a method for manufacturing a MOS device with multiple threshold voltages, which additional masks are not necessary for the method, which can reduce the difficulty and the cost of the manufacturing process.

The invention provides a reliable and cost-reduced manufacturing method for MOS devices with multiple threshold voltages.

In accordance with the foregoing and other objectives of the invention, a method for manufacturing a MOS device with multiple threshold voltages is provided. The method comprises providing a substrate. A shallow trench isolation structure is formed in the substrate. The top surface of the shallow trench isolation structure is higher than surface of the substrate. An active region which is surrounded by the shallow trench isolation structure is defined in the substrate. A first process of ion implantation is performed on the substrate except a portion of the substrate under the shallow trench isolation structure. A first spacer is formed on the sidewall of a portion of the shallow trench isolation structure above the substrate in the active region. A second process of ion implantation is performed on the substrate except a portion of the substrate under the shallow trench isolation structure and the first spacer.

The method further comprises forming a second spacer on the sidewall of the first spacer in the active region; and performing a third process of ion implantation on the substrate except a portion of the substrate under the shallow trench isolation structure, the first spacer and the second spacer.

The number of the threshold voltages in the MOS device depend on the real demand. A process of forming a spacer and performing a ion implantation can be used for additional threshold voltage in the MOS device. Furthermore, the technique of forming spacers is well developed in the modern semiconductor-manufacturing field. That is, the width of the spacers can be easily controlled for forming threshold-voltage doped regions, which can be used for forming different threshold voltages. The concentration of the doped regions is also easily controlled for different values of the threshold voltages. Besides, additional masks are not necessary for this invention, which can reduce the difficulty and the cost of the manufacturing process. Therefore, the invention provides a reliable and cost-reduced manufacturing method for MOS devices with multiple threshold voltages.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1:
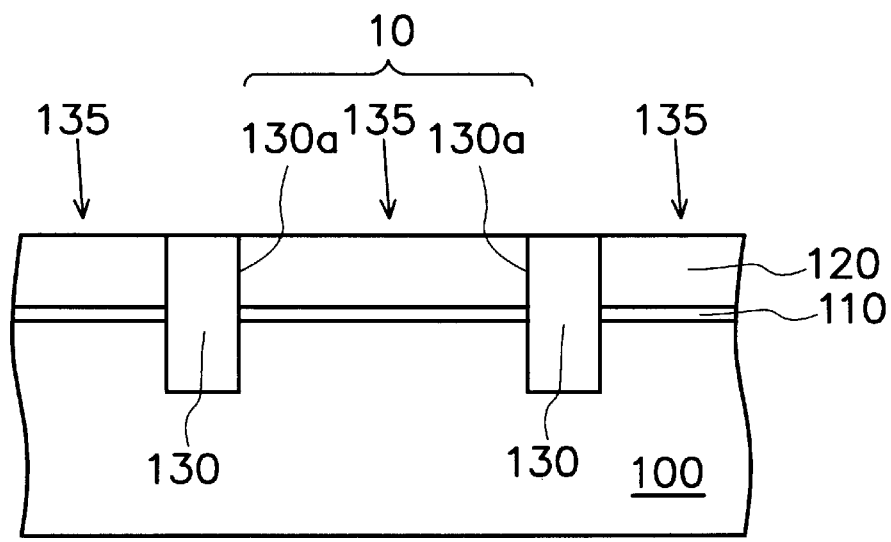
FIGS. 1–4 show schematically cross-sectional views of a method of a preferred embodiment for the invention.
Figure 2:
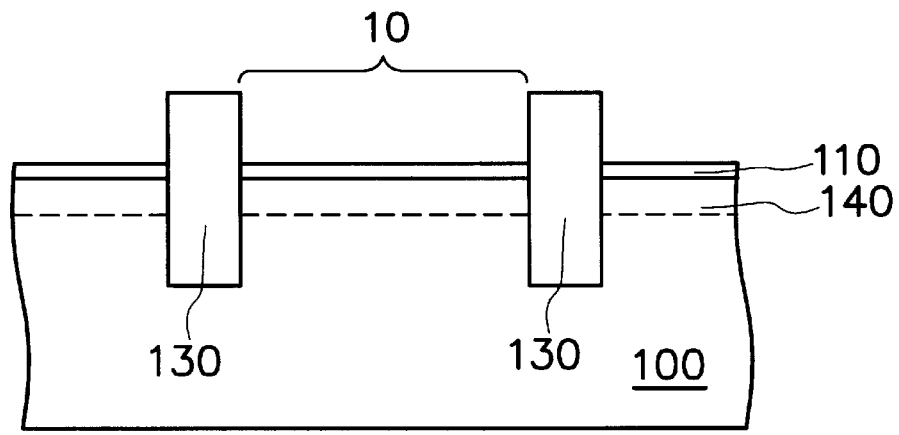

FIGS. 1–4 show schematically cross-sectional views of a method of a preferred embodiment for the invention. Refer to FIG. 1, a pad oxide layer 110 and a silicon nitride layer 120 are sequentially formed on a substrate 100. The pad oxide layer 110 is formed by thermal oxidation, for example, and a preferred thickness of the pad oxide layer 110 is about 150 Å. The silicon nitride layer 120 is formed by chemical vapor deposition, for example, and a preferred thickness of the silicon nitride layer 120 is about 2000 Å. A shallow trench isolation structure 130 is then formed in the substrate 100. The shallow trench isolation structure 130 is used to define an active region 10 for a MOS device in a memory device. The shallow trench isolation structure 130 can be formed, for example, by defining the silicon nitride layer 120 and the pad oxide layer 110 to form a trench 130a, filling silicon oxide in the trench 130a, and performing a process of planarization on the substrate 100.

The silicon nitride layer 120 is removed by, for example, using a hot solvent of phosphoric acid. The top surface of the remaining portion of the shallow trench isolation structure 130 is higher than that of the pad oxide layer 110. A process of ion implant is performed on the substrate 100 except the portion of the substrate 100 under the shallow trench isolation structure 130. A first doped layer 140 for a first threshold voltage is formed in the active region 10.

Figure 3:
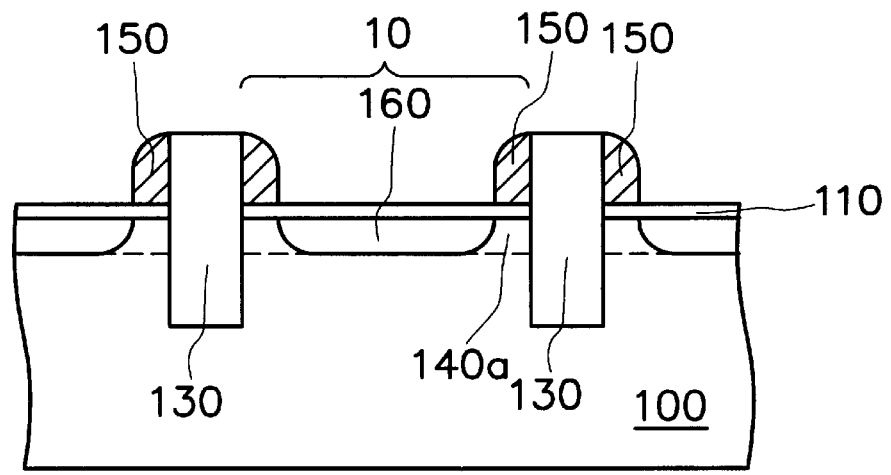

Refer to FIG. 3, a pair of spacers 150 are formed on both sidewalls of a portion of the shallow trench isolation structure 130 which is higher than the pad oxide layer 110. A process of ion implantation is performed on the substrate 100. Except the portion of the substrate 100 under the shallow trench isolation structure 130 and the spacers 150. A second threshold-voltage doped region 160 is formed in the uncover portion of the substrate 100 in the active region 10. A first threshold-voltage doped region 140a is also formed beside the second threshold-voltage doped region 160 in the active region. The width of the spacer 150 and the concentration of the second threshold-voltage doped region 160 depend on the demand for the value of the threshold voltage. For example, the width of the spacer 150 can be ranged from about 500 Å to about 1500 Å, and the dose of the implantation can be about 1~5E12/cm$^2$.

Figure 4:
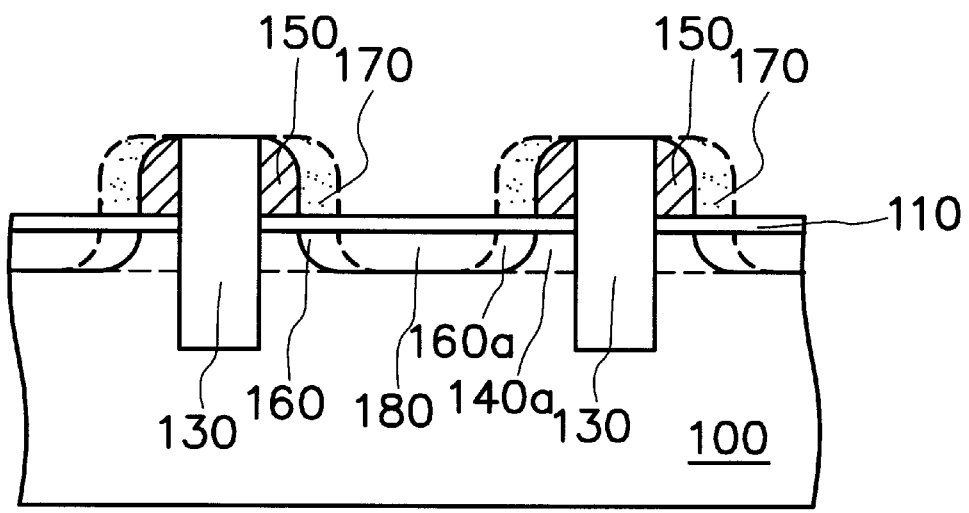

The number of the threshold voltages in the MOS device depend on the real demand. A process of forming a spacer and performing a ion implantation can be used for additional threshold voltage in the MOS device. Refer to FIG. 4, spacers 170 are formed in sidewall of the spacers 150. A process of ion implantation is then performed on the substrate 100 except for the portion of the substrate 100 under the shallow trench isolation structure 130 and the spacers 150 and 170. A third threshold-voltage doped region 180 is formed in the uncover portion of the substrate 100 in the active region 10. The MOS device possesses three threshold voltages owing to the three threshold-voltage doped region 140a, 160a and 180. The width of the spacer 170 and the concentration of the three threshold-voltage doped region 180 depend on the demand for the value of the threshold voltage. For example, the width of the spacer 170 can be ranged from about 500 Å to about 1500 Å, and the concentration of the implantation can be about 1~5E12/cm$^2$.

In the embodiment, a process of forming a spacer and performing an ion implantation are used three times for forming three threshold voltages in the MOS device. But someone skilled in the art knows that the number of the threshold voltages in a MOS device depends on how many times the process of forming a spacer and performing an ion implantation are used. In the following process for the MOS device, a gate is formed in the active region 10 of the substrate 100. The gate is formed over every threshold-voltage doped regions. Then, a pair of source/drain regions 20 are formed beside the gate in the substrate 100. After that, the MOS device including a gate and source/drain regions, which possess multiple threshold voltages is formed in the active region 10.

Figure 5:
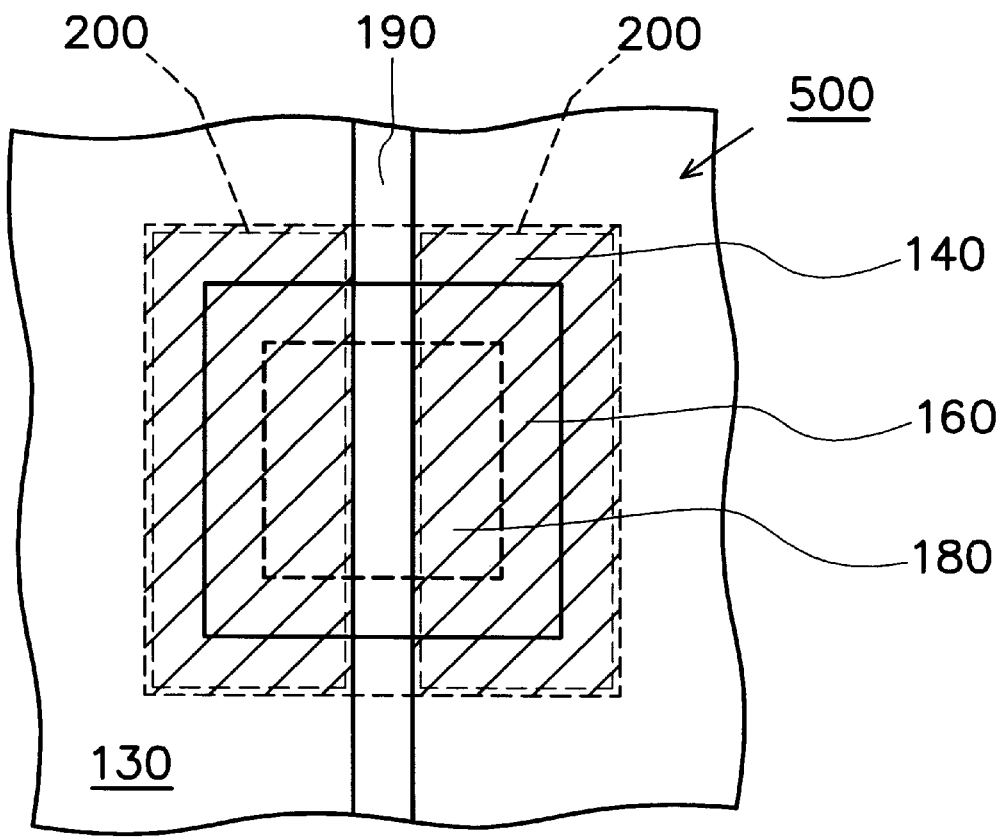
FIG. 5 shows schematically top views of a MOS device of a preferred embodiment of the invention.

Refer to FIG. 5, a MOS device 500 with three threshold voltages are described herein. The three threshold-voltage doped regions 140, 160 and 180 are surrounded by the shallow trench isolation structure 130. A gate 190 is formed over the three threshold-voltage doped regions 140, 160 and 180. A pair of source/drain regions 200 are formed beside the gate 190 in the substrate.

Figure 6:
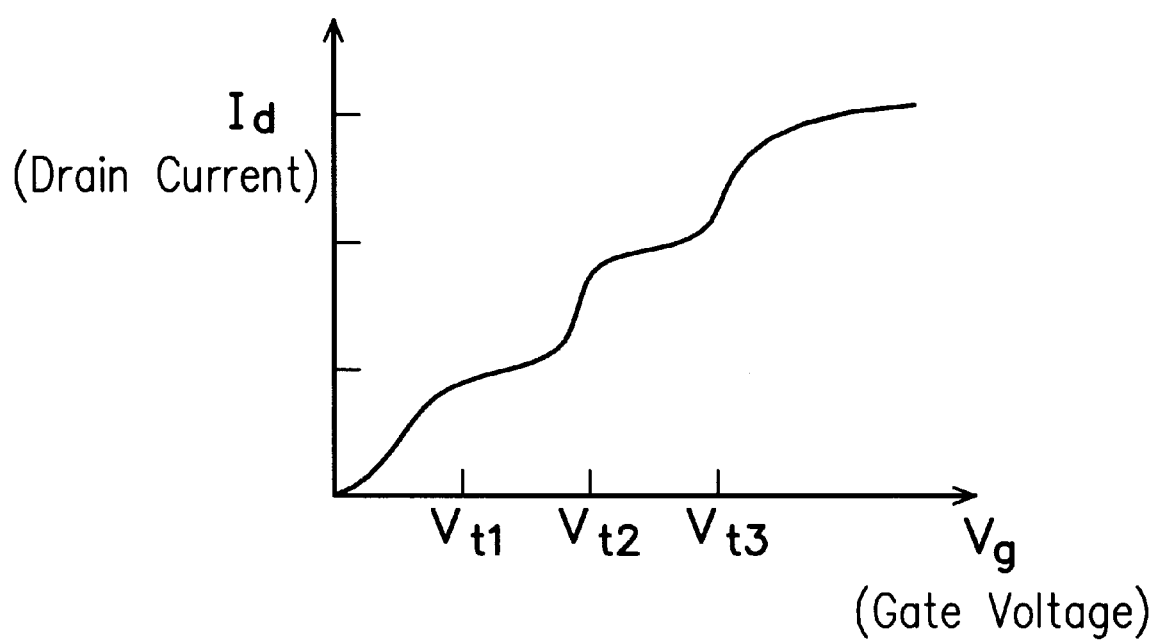
FIG. 6 shows the relationship of a gate voltage ($V_g$) and a drain current ($I_d$) in the MOS device as shown in FIG. 5.

Refer to FIG. 6, which shows the relationship of a gate voltage ($V_g$) and a drain current ($I_d$) in the MOS device 500 shown in FIG. 5. The drain current is respectively increased suddenly during the period that the gate voltage reaches a first, second and third threshold voltages ($V_{t1}$, $V_{t2}$, $V_{t3}$). Except the period the gate voltage reaches a first, second and third threshold voltages, the drain current is smoothly maintained in constant. The drain current is increased as the gate voltage is increased, which acts as a step-like function.

The technique of forming spacers is well developed in the modern semiconductor-manufacturing field. That is, the width of the spacers can be easily controlled for forming threshold-voltage doped regions, which can be used for forming different threshold voltages. The concentration of the doped regions is also easily controlled for different values of the threshold voltages. Besides, additional masks are not necessary for this invention, which can reduce the difficulty and the cost of the manufacturing process. Therefore, the invention provides a reliable and cost-reduced manufacturing method for MOS devices with multiple threshold voltages.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for manufacturing a MOS device with multiple threshold voltages, the method comprising:

providing a substrate, wherein a shallow trench isolation structure is formed in the substrate, the top surface of the shallow trench isolation structure is higher than the surface of the substrate, and an active region which is surrounded by the shallow trench isolation structure is defined in the substrate;

performing a first process of ion implantation on the substrate except a portion of the substrate under the shallow trench isolation structure;

forming a first spacer on the sidewall of a portion of the shallow trench structure above the substrate in the active region;

performing a second process of ion implantation on the substrate except a portion of the substrate under the shallow trench isolation structure and the first spacer; and forming a gate in the active region of the substrate, over every threshold-voltage doped region,
whereby a pair of source/drain regions is formed beside the gate, and
whereby a MOS device including a gate and source/drain regions, which possess multiple threshold voltages is formed in the active region of the substrate.

2. The method of claim 1, wherein before the step of forming a gate in the active region of the substrate, over every threshold-voltage doped region, the method further comprises:

forming a second spacer on the sidewall of the first spacer in the active region; and performing a third process of ion implantation on the substrate except a portion of the substrate under the shallow trench isolation structure, the first spacer and the second spacer.

3. The method of claim 1, wherein a thickness of the first spacer is ranged from about 500 Å to about 1500 Å.

4. The method of claim 1, wherein a dose of the ions used in the first and second process of ion implantation is ranged from about 1E12/cm$^2$ to about 5E12/cm$^2$.

5. A method for manufacturing a MOS device with multiple threshold voltages, the method comprising:

providing a substrate, wherein a shallow trench isolation structure is formed in the substrate, the top surface of the shallow trench isolation structure is higher than the surface of the substrate, and an active region which is surrounded by the shallow trench isolation structure is defined in the substrate;

performing a first process of ion implantation on the substrate except a portion of the substrate under the shallow trench isolation structure;

forming a first spacer on the sidewall of a portion of the shallow trench structure above the substrate in the active region;

performing a second process of ion implantation on the substrate except a portion of the substrate under the shallow trench isolation structure and the first spacer;

forming a second spacer on the sidewall of the first spacer in the active region, wherein said first spacer is formed on the sidewall of a portion of the shallow trench structure above the substrate in the active region;

performing a third process of ion implantation on the substrate except a portion of the substrate under the shallow trench isolation structure, the first spacer and the second spacer;

forming a third spacer on the sidewall of the second spacer in the active region, wherein said second spacer is formed on the sidewall of said first spacer which is formed on the sidewall of a portion of the shallow trench structure above the substrate in the active region; and performing a fourth process of ion implantation on the substrate except a portion of the substrate under the shallow trench isolation structure, the first spacer, the second spacer and the third spacer.

* * * * *